(12) United States Patent
Marek

(10) Patent No.: US 6,437,570 B2
(45) Date of Patent: Aug. 20, 2002

(54) COOLED NMR PROBE HEAD WITH UNIFORM TEMPERATURE CONTROL OF THE SAMPLE

(75) Inventor: Daniel Marek, Moeriken (CH)

(73) Assignee: Bruker BioSpin AG, Faellanden (CH)

( * ) Notice: Subject to any disclaimer, the term of this patent is extended or adjusted under 35 U.S.C. 154(b) by 0 days.

(21) Appl. No.: 09/765,277

(22) Filed: Jan. 22, 2001

(30) Foreign Application Priority Data

Feb. 12, 2000 (DE) .......................................... 100 06 323

(51) Int. Cl.[7] ................................................. G01V 3/00
(52) U.S. Cl. ........................ 324/321; 324/322; 324/300
(58) Field of Search ................................ 324/321, 315, 324/314, 309, 307, 300, 322, 318, 248; 505/845; 335/300

(56) References Cited

U.S. PATENT DOCUMENTS

| | | | | |
|---|---|---|---|---|
| 5,192,910 A | | 3/1993 | Hepp ......................... | 324/321 |
| 5,247,256 A | | 9/1993 | Marek ........................ | 324/315 |
| 5,689,187 A | * | 11/1997 | Merak et al. ............... | 324/321 |
| 5,889,456 A | * | 3/1999 | Treiebe et al. .............. | 335/300 |
| 5,986,453 A | * | 11/1999 | Ansrson et al. ............. | 324/300 |

\* cited by examiner

*Primary Examiner*—Edward Lefkowitz
*Assistant Examiner*—Brij B. Shrivastav
(74) *Attorney, Agent, or Firm*—Paul Vincent

(57) ABSTRACT

An NMR (=nuclear magnetic resonance) probe head comprising an RF (=radio frequency) receiver coil system, which can be cooled down to cryogenic temperatures, and a room temperature pipe (5), extending in a z direction, for receiving a sample tube containing sample substance to be examined by NMR measurements is characterized in that a temperature control (11) is disposed between the RF receiver coil system and the sample tube which surrounds the sample tube in a radial direction and extends in the z direction and is almost completely transparent to RF fields, or at least has an absorption of <5%, preferably <1% for RF fields to thereby provide simple and substantial reduction in the temperature gradient in the z direction during operation without thereby impairing the NMR measurement.

38 Claims, 9 Drawing Sheets

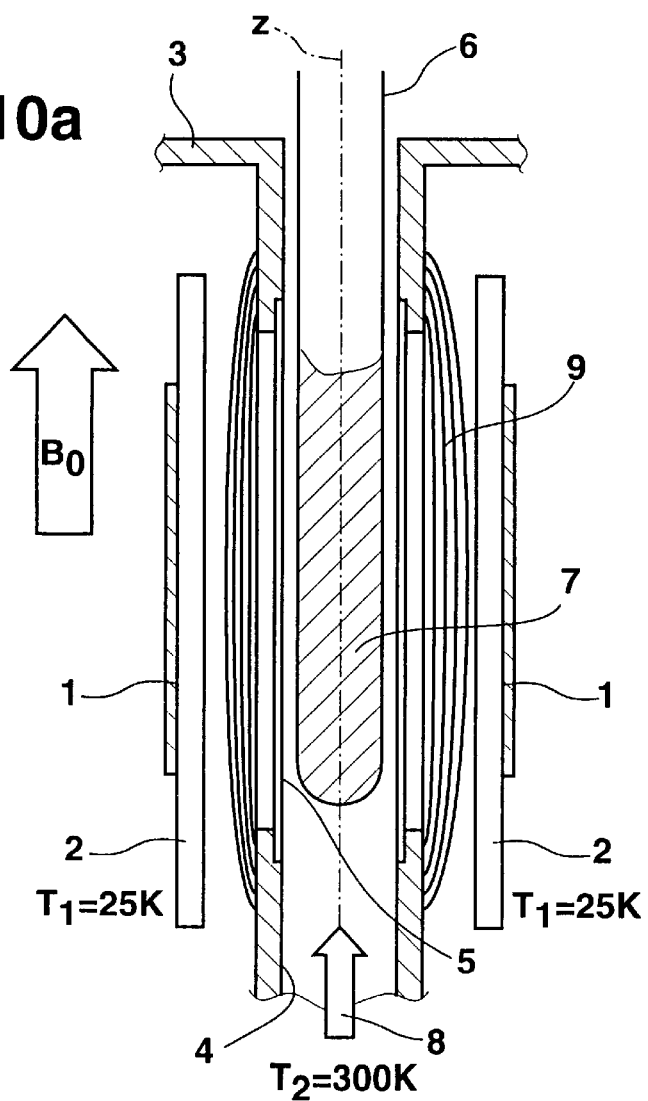
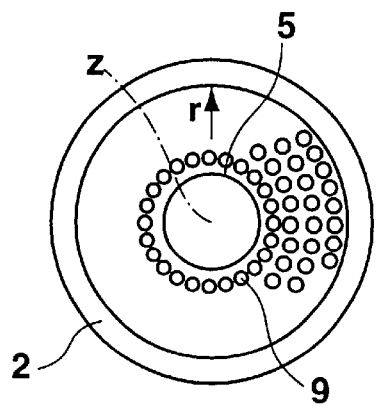

COOLED NMR PROBE HEAD WITH UNIFORM TEMPERATURE CONTROL OF THE SAMPLE

This application claims Paris Convention priority of DE 100 06 323.3 filed Feb. 12, 2000 the complete disclosure of which is hereby incorporated by reference.

BACKGROUND OF THE INVENTION

The invention concerns an NMR (=nuclear magnetic resonance) probe head comprising an RF (=radio frequency) receiver coil system, which can be cooled down to cryogenic temperatures, and a room temperature pipe extending in a z direction for receiving a sample tube containing a sample substance to be examined through NMR measurements.

A cooled NMR probe head of this type is e.g. known from U.S. Pat. No. 5,247,256.

The probe head is installed in a magnet, for generating a highly homogeneous static $B_0$ field, and comprises RF receiver coils disposed about a z axis which are cooled down during operation to temperatures of approximately 10 to 25 K by means of suitable heat exchangers and heat conducting elements to improve the signal-to-noise-ratio of the received NMR signal during the measurement. The RF receiver coils are in an evacuated region for heat insulation reasons which is formed essentially by a usually metallic casing of the probe head which is penetrated by a room temperature pipe disposed cylindrically about the z axis for receiving a sample tube. To permit passage of the RF signals from the sample to the RF receiver coils, the otherwise metallic room temperature pipe is replaced in the axial region of the coils by an RF permeable inner pipe, in most cases a glass pipe, which is connected to the metallic parts of the room temperature pipe in a vacuum-tight fashion.

After insertion of the sample tube into the room temperature pipe from the bottom, it is substantially maintained at a desired temperature (usually approximately 300K) using warm air flowing from below through the room temperature pipe to control the temperature of the sample substance. This, however, causes the associated problem that the measuring sample "feels" the considerably cooler surroundings of the NMR resonator, cooled down to 10 to 25 K, and radially radiates heat in this direction. This lost heat must be continuously replenished by the surging warm tempering air flow to ensure that the measuring sample remains essentially at the desired temperature. In consequence, an axial and radial temperature gradient is produced in the measuring sample which strongly impairs the NMR measurement.

It is therefore the underlying purpose of the present invention to provide a cooled NMR probe head comprising the above-mentioned features wherein the temperature gradient in the z direction occurring during operation is considerably reduced without thereby impairing the NMR measurement.

SUMMARY OF THE INVENTION

This object is achieved in accordance with the present invention in a both surprisingly simple and effective manner by providing a tempering means between the RF receiver coil system and the sample tube which extends in the z direction and radially surrounds the sample tube and is almost completely transparent to RF fields, or at least has an absorption for RF fields of <5%, preferably <1%.

In addition to exchangeable sample tubes, the NMR probe heads in accordance with the invention also include so-called flow-through heads wherein the sample tube remains fixedly installed and the fluid to be examined is introduced through a thin conduit on the one side (bottom) and is guided out on the other side (top). Probe heads of this type may be used in continuous passage and also in a flow and stop mode (for an extended measuring period). These probe heads are used for rapid introduction of the sample as well as for an important analysis step following a liquid chromatography separating cell. The former are called flow-through probe heads, the latter LC-NMR coupling. Probe heads of this type are also referred to as LC heads (liquid chromatography, in particular also HPLC High Pressure Liquid Chromatography). Probe heads of this type can particularly profit from cryotechnology and also from the modifications in accordance with the invention.

These inventive modifications prevent dissipation of heat from the measuring sample and thus uneven cooling without significantly impairing the received NMR signals. The principal advantage of such a tempering means compared to a conventional heated air flow for the sample tube is the fact that the thermal efficiency can act uniformly through the entire axial length of the sample tube. The central area is thus as well tempered as the edge areas thereby effectively preventing axial temperature gradients.

The heating means in accordance with the invention can be used individually and also in combination with an air flow tempering means. A combination of both heating types is particularly advantageous for optimum suppression of the residual temperature gradients.

In contrast thereto, a conventionally heated air flow, without the heating means in accordance with the invention, usually enters into the room temperature pipe at the lower end of the sample tube, starts to heat up the sample tube at this location and continues to cool down while rising in the axial direction. The temperature of the heated air flow in the upper region of the sample tube will therefore always be less than in the lower area thereby inevitably reducing the tempering performance in the upper region of the sample tube. As a result, there will always be an axial temperature gradient which can be somewhat reduced by increasing the amount of air per unit time, however cannot be prevented in principle. Moreover, the corresponding countermeasures are highly limited since, if the amount of air per unit time is too large, vibration free positioning or proper rotation of the sample tube can no longer be guaranteed.

Through corresponding selection of the tempering means with respect to its absorption behavior of RF fields, one tries to obtain an almost complete transparency to the RF fields to allow as free a passage as possible of the measuring signal from the sample to the RF receiver coil system.

The tempering means of the inventive NMR probe head can be realized in technically completely different ways, e.g. through heating with electric current but also heating through radiation or thermal conduction in the region about the sample tube.

A particularly preferred embodiment of the inventive NMR probe head is characterized in that the tempering means comprises a layer radially surrounding the sample tube in the axial region of the RF receiver coil system having a radial thickness of <1 mm, preferably <50 $\mu$m and which is made from a material which at least partially absorbs radiation in a wavelength range of 100 nm$\leq\lambda\leq$100 $\mu$m and which is transparent to radiation in a wavelength range of $\lambda$>100 mm. Absorption of thermal radiation in the layer permits temperature control of the sample tube in the corresponding axial region.

The NMR probe head in accordance with the invention preferably comprises a heating means for uniformly heating the layer, which can be designed with different technical means.

A preferred further development is characterized in that the heating means comprises a device for irradiating the layer with radiation in a wavelength range of 100 nm≦λ≦100 μm, in particular with thermal radiation thereby providing contact-free and uniform heating of the layer.

The device for irradiating the layer is preferably disposed on the side of the room temperature bore facing the RF receiver coil system. Since the receiver coil system is generally accommodated in an evacuated region, the thermal radiation can pass through the vacuum to the heating layer without obstruction.

One further development is particularly space-saving with which the layer is disposed on the side of the room temperature pipe facing the RF receiver coil system.

Many materials which can be used to construct the room temperature pipe already absorb in the desired wavelength range such that heating up using radiation does not require a special radiation-absorbing layer.

The radiation absorbing heating layer may surround the room temperature pipe over a large area. Alternatively, the layer may be disposed about the room temperature pipe in axially extending strips disposed at a separation from one another in the peripheral direction.

One further development is particularly preferred in which the layer is electrically conducting and can be heated through application of an electric voltage.

Alternatively or additionally, a further embodiment provides that the tempering means comprises one or more heating coils of thin, in particular layered, electrically good conducting material each comprising an outgoing and return conductor. The outgoing and return conductors of the heating coils are electrically connected to one another at one end and can be supplied with heating current from a current source at the other end.

A preferred further development of this embodiment is characterized in that the heating coils are formed of an electrically conductive layer which radially surrounds the sample tube in the axial region of the RF receiver coil system, has a radial thickness of <1 mm, preferably <50 μm and is transparent to radiation in a wavelength range of λ>100 mm. This layer may be radiation-absorbing as in the above-described embodiments to allow heating in two different ways.

In a particularly preferred manner, the outgoing and return conductors of the heating coils are disposed bifilarly at as small a separation from one another as possible to minimize generation of a disturbing magnetic field during current flow.

In this connection, it is advantageous if the outgoing and return conductors of the heating coils consist of two longitudinal strips disposed one on top of the other which are electrically insulated from one another by an insulation layer or insulation strip.

A further development is particularly preferred with which the outgoing and return conductors of the heating coils are made from materials having different magnetic susceptibilities and which are selected such that each overall heating coil is magnetically compensated towards the outside to prevent formation of additional magnetic fields during current flow which would deteriorate the resolution of the recorded NMR spectra.

The tempering means can be geometrically designed such that one or more heating coils are disposed in a spiral fashion about the room temperature pipe.

As an alternative, it is also possible to dispose several, preferably at least 8, heating coils at a separation from one another in the peripheral direction about the z axis of the room temperature pipe, which extend parallel to the z direction.

Advantageously, the heating coils are spatially oriented such that they are minimally coupled to the RF receiver coil system.

One embodiment of the heating coils having a material exhibiting as good an electrical conductance as possible (e.g. Cu) is particularly preferred wherein the conductors have rectangular, possibly square or circular cross-sections (typically of a magnitude of 10 μm×10 μm or less). Due to the resulting very small overall surface covering, the room temperature pipe maintains its good permeability to RF fields, and the RF losses are also very low due to both the small surfaces of the heating conductors and the good electrical (and thus RF) conductivity.

In a preferred further development of the above-described embodiment, a low-pass filter may be provided between the current source and the heating coils to minimize signal distortion and residual attenuation.

One further development is also preferred in which a parallel resonant circuit is provided between the current source and the heating coils whose resonance frequency is the most sensitive RF frequency relevant for NMR measurements. Such a rejector circuit also prevents transmission of disturbing signals to the RF receiver coil system and minimizes unwanted coupling-out of the RF signals via the heating coils.

In a further development, the current source advantageously supplies the heating coils with alternating current in order to keep further disturbances in the static magnetic field as small as possible.

In this connection, the angular frequency $\omega_H$ for the heating current $I_H=I_0 \cdot \cos\omega_H t$ through the heating coils should be selected such that the corresponding side bands are outside of the observeable NMR spectrum.

In particular, the following should hold: 1 kHz≦$\omega_H$/2π≦10 GHz, preferably 10 kHz≦$\omega_H$/2π≦1 MHz. It is generally advantageous if the tempering means, in particular the room temperature pipe itself, a heating layer and/or heating coils are formed of a material having good thermal conductance which permits particularly uniform heating along the entire surface of the corresponding heating means to counteract formation of temperature gradients in the sample tube.

A particularly preferred embodiment of the NMR probe head in accordance with the invention provides for radiation shields disposed between the RF receiver coil system and the room temperature pipe which surround the room temperature pipe in a radial direction, extend in the z direction and are made of one or more materials oriented in the z direction which are almost completely transparent to RF fields or at least have an absorption of <5%, preferably <1% for RF fields.

Although cryotechnology has used radiation shields for some time to curtail heat radiation losses, this procedure is not directly applicable for a cooled NMR probe head since the normally metallic radiation shields, which reflect heat radiation, either completely block or at least strongly impair propagation of RF fields from the measuring sample to the RF receiver coils such that the incoming NMR signals are at least highly attenuated, distorted or completely unusable.

In accordance with the inventive solution, the radiation shields provided in the vacuum between the RF coils and the room temperature pipe solely comprise materials which are oriented in the z direction. The axial orientation of the radiation shield material prevents their finite susceptibility from impairing the resolution of the NMR signals. On the other hand, the physical properties of the materials should be such as to effect as large a transparency as possible in the region of radio frequency radiation. In most cases, this material property has the associated disadvantage that reflection of lost heat back towards the measuring sample is not very high.

It is advantageous if the radiation shields have at least a minimum separation from one another in the radial direction and do not contact each other or at the most contact at points or linearly to prevent direct heat conduction between the individual radiation shields in a radial direction which would lead to a thermal "short circuiting". Occasional contact between the radiation shields is not a serious problem, in particular if the chosen material has very low heat conduction. As long as the individual contacting points or lines are sufficiently spaced apart from one another, the overall heat conduction between the radially disposed radiation shields can be essentially neglected for the purposes of the invention.

One further development is particularly preferred, wherein the radiation shields are constructed from a material which reflects or at least absorbs radiation in a wavelength range of 10 $\mu m \leq 100$ $\mu m$ and which is transparent to radiation in a wavelength range of $\mu > 100$ mm. The former wavelength range corresponds to heat radiation at a temperature of between approximately 20K to 300K which corresponds to the temperature difference between the measuring sample and the cooled NMR coils. The latter wavelength range corresponds to radiation of a frequency below 3 GHz, wherein the RF range which is important for NMR measurements is between several MHz and below approximately 1 GHz.

An optimum material which has practically no absorption losses in the considered RF range, and on the other hand is not transparent in the above-mentioned heat radiation range, is e.g. glass or quartz.

The radiation shields of the NMR probe head in accordance with the invention could theoretically be configured as tubes coaxially surrounding the room temperature pipe. The tube material would, however, normally be excessively thick. The radiation shields could also be constructed from a unidirectional foil whose production and processing is, however, relatively difficult. Orientation of the foil along the z axis can be realized e.g. through application of mechanical tensile stress. In contrast thereto, one embodiment is preferred, in which the radiation shields are made from a unidirectional fabric. Unidirectional fabric of this type having correspondingly suitable materials is commercially available.

These fabrics preferably consist of fiber mats, in particular fiber glass mats which are made of fibers having a diameter of less than 10 $\mu m$ and a total thickness of approximately 30 $\mu m$. When using such fiber glass mats, it would be feasible to wind them in several layers in a spiralling fashion about the room temperature pipe on its vacuum side instead of providing a radial sequence of individual cylindrical radiation shields.

In a further particularly preferred embodiment, the radiation shields are formed of rods or fibers, preferably glass fibers and/or quartz fibers oriented in the z direction and radially disposed about the axis of the room temperature pipe. Fibers of this type are available with diameters of between 10 and 50 $\mu m$. Although, glass filaments having a diameter of less than 5 $\mu m$ are also available, these would probably be difficult to work with.

In a preferred further development, the radiation shields are formed of fiber bundles having somewhat higher overall mechanical stability than the individual filaments and are thus easier to work, similar to rods.

In embodiments of the invention, the rods or fibers may be disposed freely in space and be fastened only at their ends.

Alternatively, the rods or fibers may be mounted to a support pipe disposed coaxially with respect to the room temperature pipe, preferably on the side of the room temperature pipe facing the RF receiver coil system.

In a preferred further development the rods or fibers are mounted to the support pipe or room temperature pipe using a glue transparent to RF radiation in order to prevent attenuation of the RF radiation from the measuring sample to the RF receiver coil due to gluing.

One further development is also advantageous, wherein the rods or fibers are densely packed in the peripheral direction about the axis of the room temperature pipe to prevent visible gaps "as viewed" in the radial direction. In this fashion, the rods or fibers each form a radiation shield connected in the peripheral direction.

One embodiment of the NMR probe head in accordance with the invention is particularly preferred in which a centering device is disposed about the axis of the room temperature pipe for centering the sample tube in its measuring position. The transverse temperature gradients, extending radially with respect to the z axis, which can occur during operation of a cooled NMR probe head are given by the product of the heat loss per unit surface, the reciprocal value of the mass flow of tempering gas and a symmetry factor which includes a displacement or angular deviation of the sample tube axis from the z axis of the room temperature pipe. Since this asymmetry appears as a factor in the overall product, even small inclinations of the measuring sample within the room temperature pipe have a large influence on the tempering flow. Therefore, the proposed centering device can have an additional considerable effect with regard to a reduction in the temperature gradients and an improvement of the quality of the NMR signals.

In a further development which is particularly easy to realize, the centering device comprises one or more spacers disposed between the room temperature pipe and the sample tube and symmetrically distributed about the z axis of the room temperature pipe.

These spacers may be disposed in the area of the bottom of the sample tube in its measuring position and/or in the area of the feed opening of the room temperature pipe on the side of the room temperature pipe facing the sample tube. Alternatively, the spacers may extend over the entire axial length of the RF receiver coil system.

One further development is also advantageous, wherein the spacers consist of strips of elastic material extending in the direction of the z axis which are rigidly connected to the room temperature pipe at their ends facing away from the sample glass in its measuring position and whose ends facing the sample glass in its measuring position have a bead which is bulged towards the sample glass and whose free leg seats on the room temperature pipe.

To prevent disturbance of the NMR measurements, the spacers should be produced from a material which is transparent to RF radiation.

In a preferred further development, the spacers consist of sheet metal strips having a thickness of approximately 100 μm and a width transverse to the z axis of approximately 0.5 mm to 2 mm, preferably approximately 1 mm.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 3b shows the temperature distribution in the z direction associated with the arrangement according to FIG. 3a;

FIG. 4b shows the associated temperature dependences in the direction of the z axis on the left and right-hand side of the arrangement of FIG. 4a;

FIG. 10a shows a schematic vertical section through an inventive NMR probe head with thermal shields between the room temperature pipe and the RF receiver coil system;

FIG. 10b shows a schematic horizontal section through an arrangement according to FIG. 10a in the axial region of the RF receiver coil system;

FIG. 11b shows a horizontal section through an arrangement according to FIG. 11a.

DESCRIPTION OF THE PREFERRED EMBODIMENT

Figure 1:
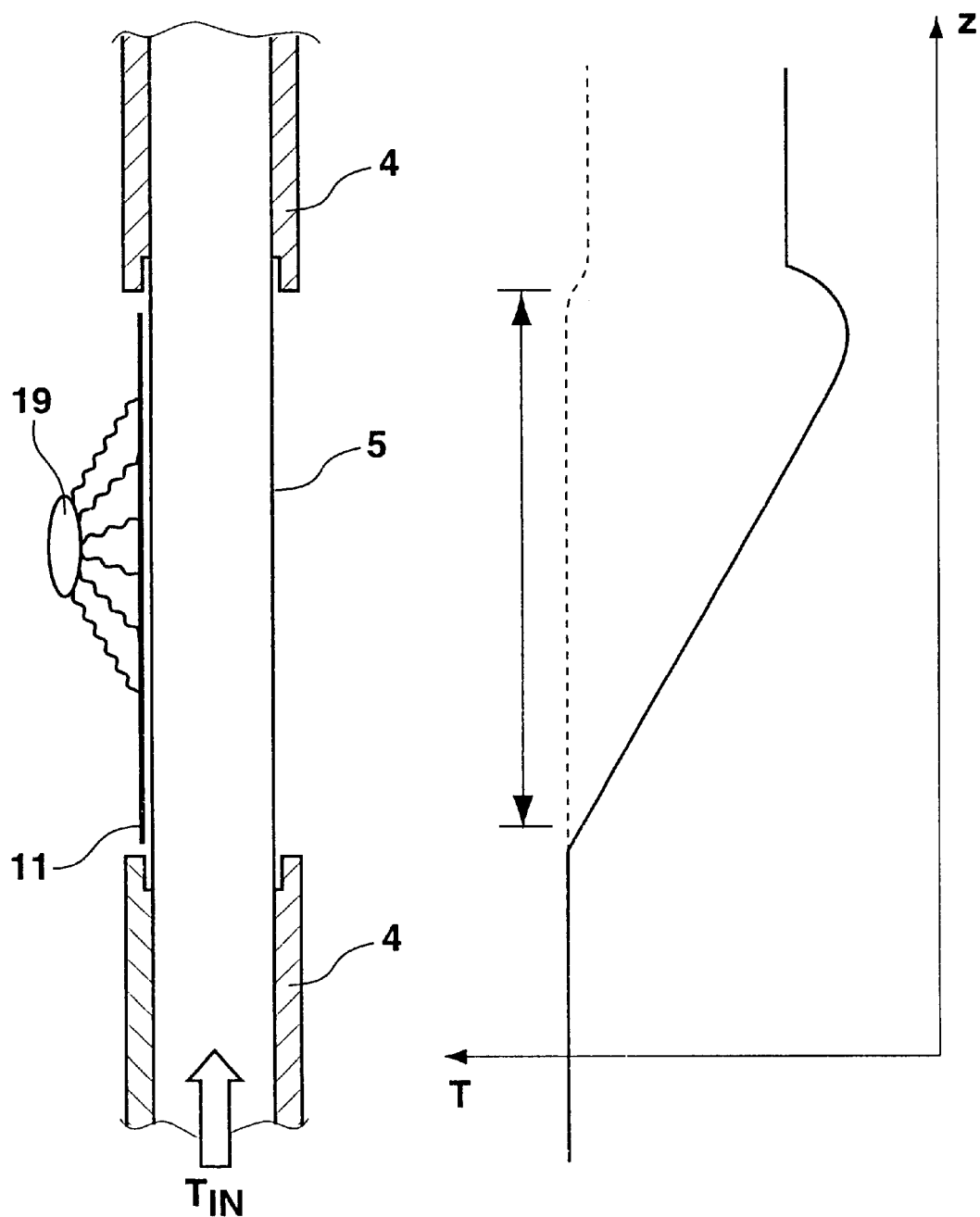
FIG. 1 shows a schematic vertical section along the z axis through an NMR probe head in accordance with the invention in the vicinity of an RF receiver coil system, including tempering means and associated temperature dependence along the z axis.

FIG. 1 shows a schematic vertical section through an inventive NMR probe head comprising a tempering means 11 in the axial region of the inner tube 5 of a room temperature pipe 4 and the associated temperature dependence along the z axis. The tempering means 11 can be effected e.g. via electric heating and/or radiation heating of a corresponding surface on the room temperature pipe 4 in the region of the inner tube 5 by means of a heating means 19. The temperature dependence along the z axis shown on the right-hand side illustrates (solid lines) the situation without tempering means and (broken lines) the situation with regulated tempering means, indicating a nearly constant temperature along the entire z axis.

Further details of the inventive NMR sample head can be extracted i.a. from FIG. 10a described below.

Figure 2:
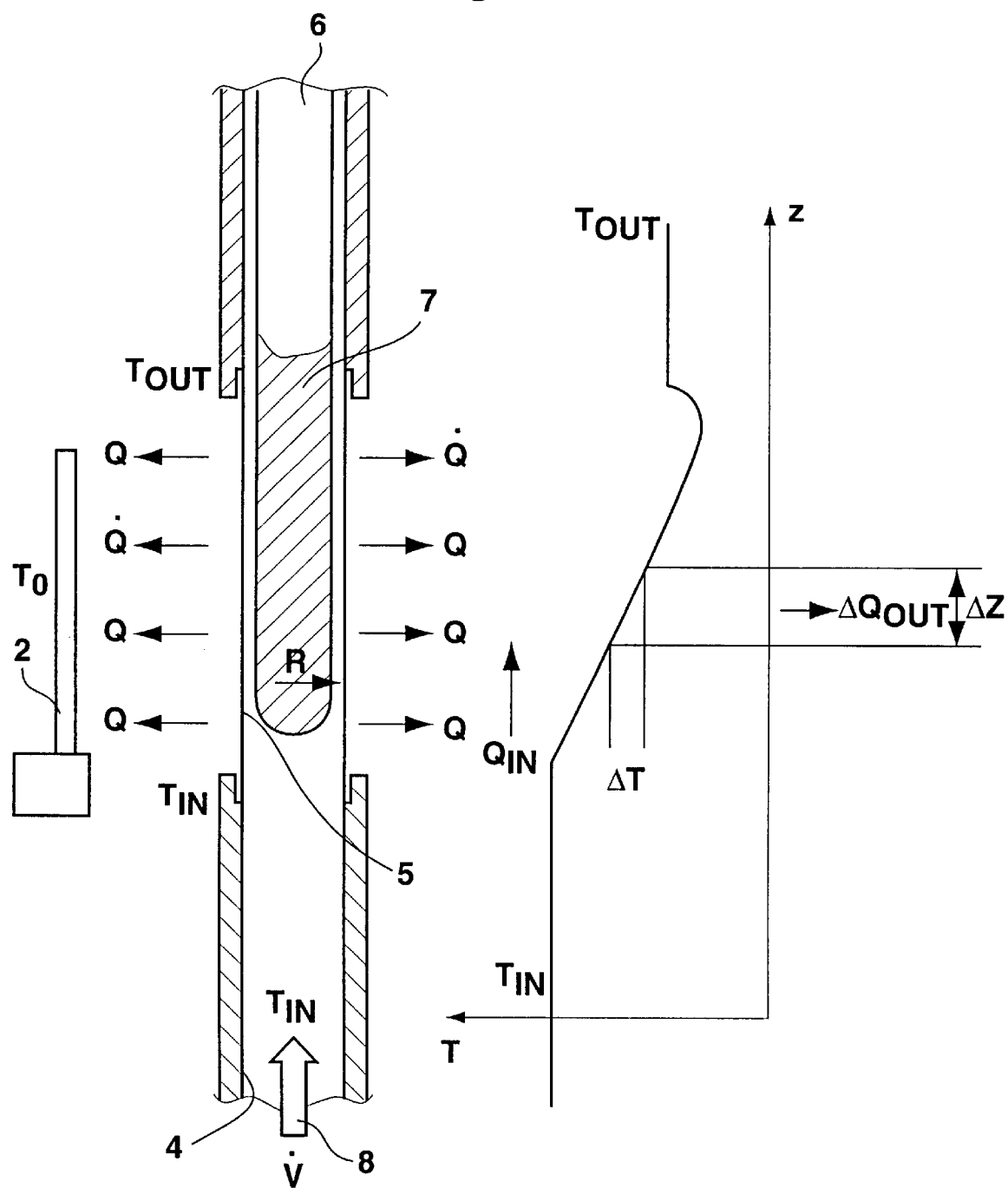
FIG. 2 shows a schematic vertical section through a cooled prior art NMR probe head with associated temperature dependence in the direction of the z axis.

The operation of the inventive arrangement is explained below:

FIG. 2 schematically shows a section of an NMR probe head of prior art, wherein radiative heat flow Q passes from a sample tube 6 in a radial direction towards the RF receiver coil system 1 since the receiver coil system 1 is maintained at a cryogenic temperature of approximately 25K while the sample tube 6 should be held approximately at room temperature using the tempered air flow 8 supplied from below. The heat radiation from the sample tube 6 results, taking into consideration the heat supplied by the tempering flow 8, in a temperature dependence in an axial direction within the sample tube 6 as schematically shown on the right hand side of FIG. 2.

The relatively high temperature gradients within the sample substance 7 often result in an undesired deterioration of the recorded NMR spectra. The lines widen due to the temperature dependence of the chemical shift which can prevent simultaneous shimming of two substances. This effect is particularly distinct with water.

In addition, convection effects may occur if the temperature gradient has exceeded a critical value. The resulting fluctuations can considerably impair stability during shimming and during NMR experiments.

Figure 3A:
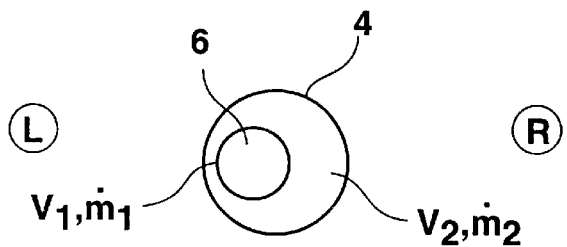
FIG. 3a shows a schematic horizontal section through an arrangement comprising a sample tube introduced asymmetrically into the room temperature pipe.

In addition to the temperature gradients in the z direction, transverse gradients can also occur if the sample tube 6 is not positioned exactly in the center of the room temperature pipe 4, as schematically shown in the horizontal section of FIG. 3a.

Figure 3B:
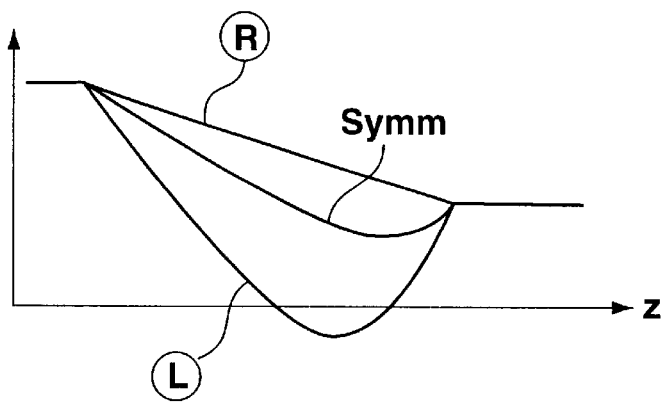

Due to the differing mass flow resulting from the differing flow resistances on the left (L) and right (R) sides, differing longitudinal gradients occur on either side, leading to a transverse temperature gradient which becomes more distinct towards the top, as shown in FIG. 3b. Of the three temperature dependences shown, the middle one illustrates the symmetric case.

Figure 4A:
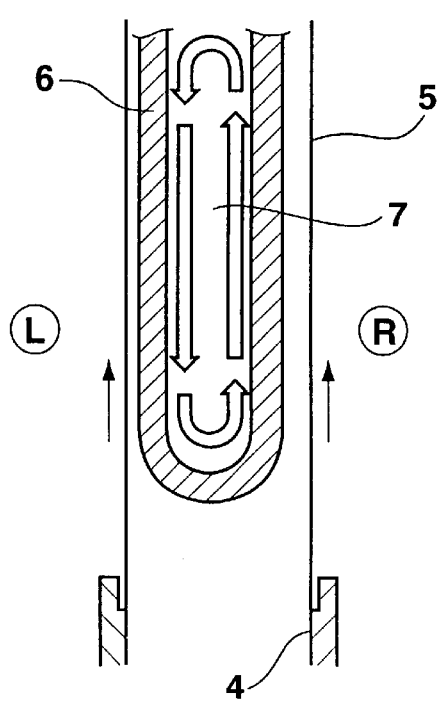
FIG. 4a shows a schematic vertical section through a room temperature pipe with asymmetrically introduced sample tube and indicated convection flows within the measuring sample.
Figure 4B:
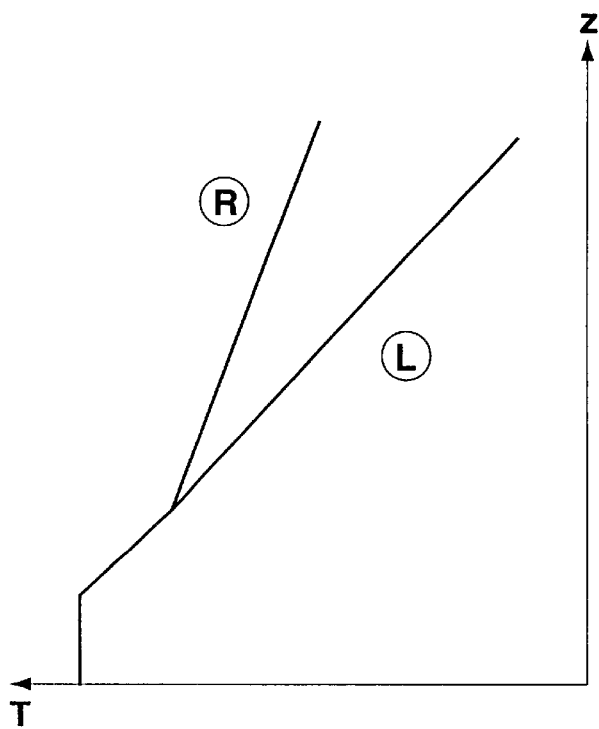

This gradient additionally promotes formation of convection within the normally liquid sample substance 7, as is schematically shown in FIG. 4a. The associated temperature dependences in the z direction are shown in FIG. 4b. The temperature dependence on the right-hand side (=R) may thereby considerably differ from the temperature dependence on the left-hand side (=L).

To counteract this effect, the central part 5 of the room temperature pipe 4 is made from a material having good heat conduction to thereby considerably reduce the transverse temperature gradients (x-y direction). However, only those materials are acceptable having negligibly small RF radiation absorption while also exhibiting the required high heat conductivity. A concrete example is sapphire.

Figure 5:
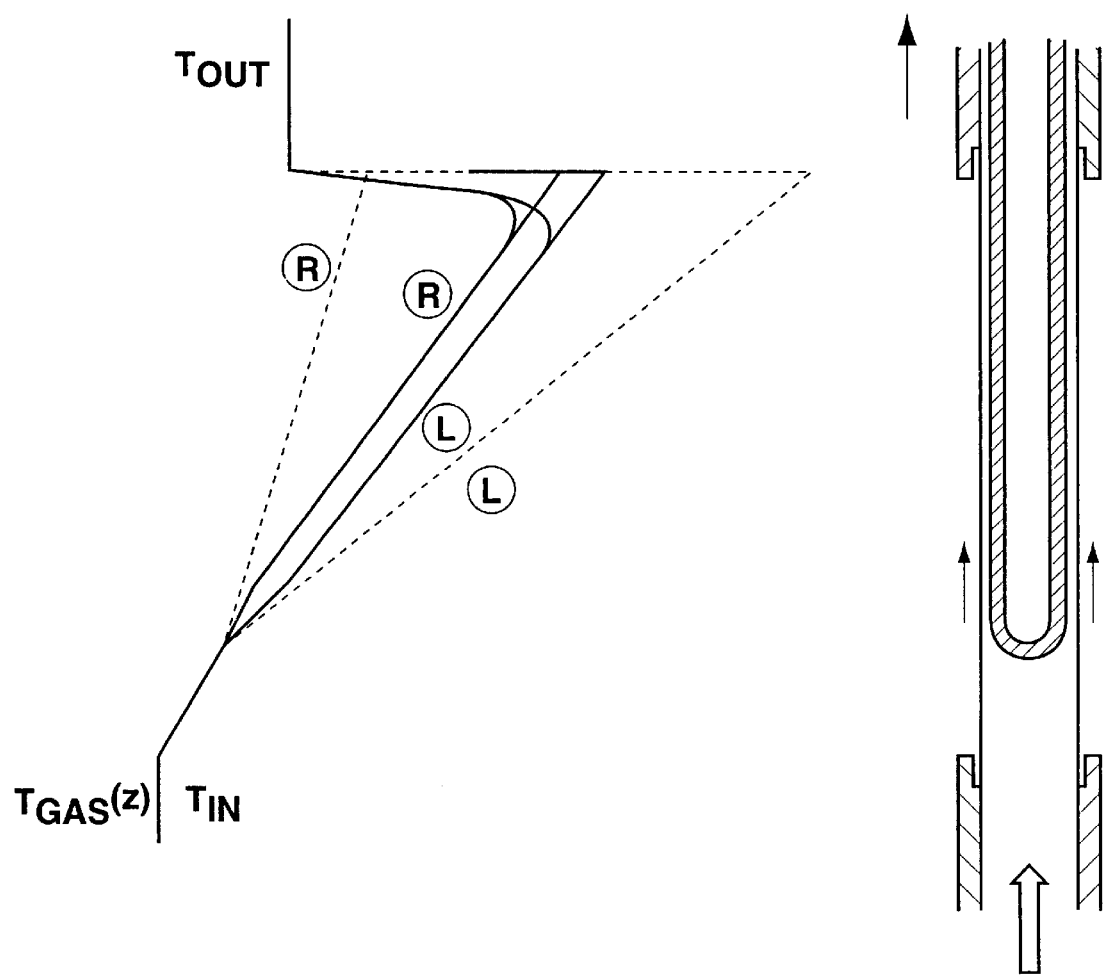
FIG. 5 shows a schematic temperature dependence of the tempering gas in the direction of the z axis with the sample tube being introduced asymmetrically into the room temperature pipe, with the inner side of the room temperature pipe in the region of the RF receiver coils having good heat-conducting properties.

FIG. 5 shows this situation with poor heat conductivity (broken lines) and with good heat conductivity (solid lines) for the room temperature pipe 4, in particular of the inner pipe 5. The temperature dependence along the z axis cannot be substantially influenced thereby (except for averaging of the two extrema). Only the temperature dependence directly before the upper clamping point of the sample tube 6 can be improved. It is not possible to eliminate a linear temperature gradient merely through heat-conducting measures on the room temperature pipe 4.

This is where the invention starts, according to which a tempering means 11 is disposed between the RF receiver coil system 1 and the sample tube 6 which extends in the z direction and surrounds the sample tube in the radial direction and is almost completely transparent to RF fields.

In embodiments of the invention which are not further represented in the drawing, the tempering means 11 consists of a heating means 19. A layer can be additionally disposed on the sample tube 6 for absorbing thermal radiation which achieves the considerably improved axial temperature dependence in the sample tube 6 described above for FIG. 1.

Figure 6A:
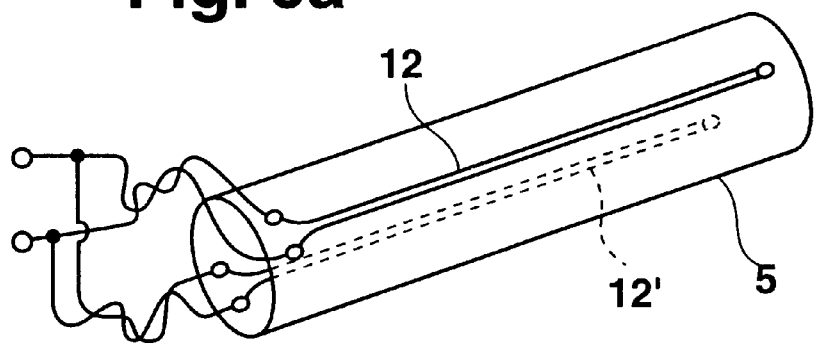
FIG. 6a shows a schematic representation of an embodiment of the invention with two opposite electric heating coils extending along the room temperature pipe.

The tempering means 11 can comprise supplementary, additionally or alternatively also electrically heatable elements, in particular heating coils 12, 12' as shown in FIG. 6a opposite to and in the z direction along the inner tube 5 of the room temperature pipe 4.

In any case it is recommended to produce the inner tube 5 of a material having good heat conductance (e.g. sapphire).

Figure 6B:
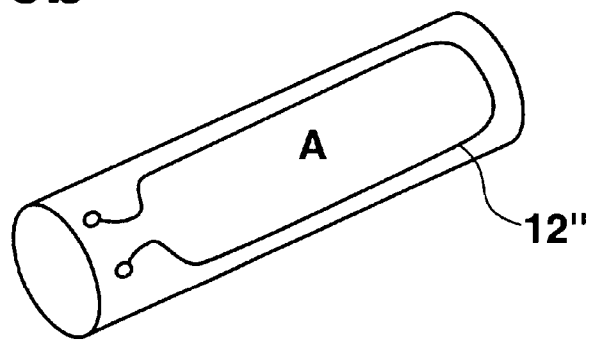
FIG. 6b corresponds to FIG. 6a, wherein the surface A surrounded by the heating coils is larger.

FIG. 6b schematically shows a heating coil 12" comprising a relatively large surface A which should be prevented in practice. The surface A of the coil should be minimized since too large a surface could cause considerable disturbance of the homogeneous magnetic field $B_0$ in the measuring position of the inventive NMR sample head due to fields which extend perpendicular thereto when current flows through the heating coils.

Figure 6C:
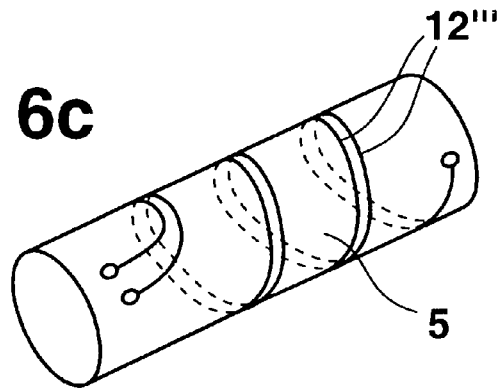
FIG. 6c shows an embodiment with spiralling heating coil.

FIG. 6c shows an inventive arrangement comprising a heating coil 12''' spirally wound about the inner tube 5 wherein the surface between the two electric conductors is kept as small as possible for the above-mentioned reasons.

Figure 7:
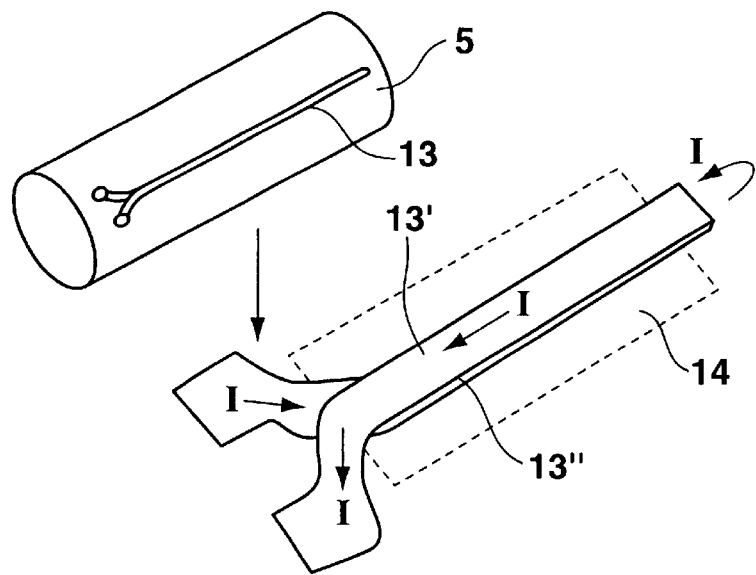
FIG. 7 shows a schematic representation of an embodiment with two thin layers of a heating coil which are separated through an insulation foil.

In a further embodiment it can be advantageous to form the heating coil 13 of two thin layers 13', 13"—as shown in FIG. 7—which are disposed one on top of the other and are electrically separated from one another by a thin insulating foil 14. This virtually prevents generation of disturbing magnetic fields when a current flows through the heating coil 13.

Copper or aluminium would be suitable materials for the layers 13, 13". $Al_2O_3$ would be suitable for the insulating layer 14. An arrangement of this type can also consist of a combination of different materials for the layers 13' and 13" wherein same should be selected such that the overall heating coil 13 is magnetically compensated towards the outside.

Suitable orientation of the tempering means 11 with respect to the most sensitive RF receiver coils used minimizes electromagnetic coupling with the RF receiver coil system 1.

Figure 8B:
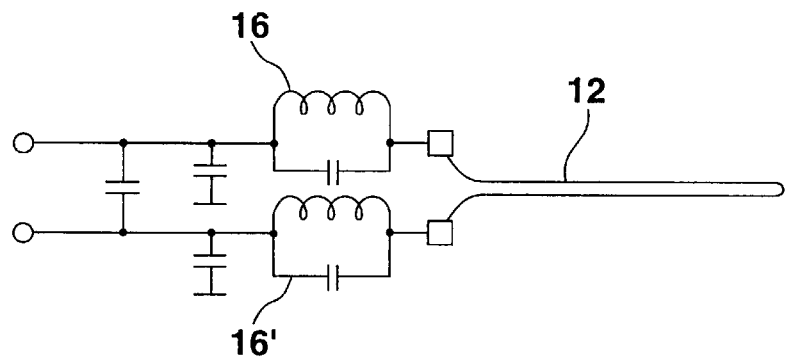
FIG. 8b corresponds to FIG. 8a, however, with upstream rejector circuits.
Figure 8A:
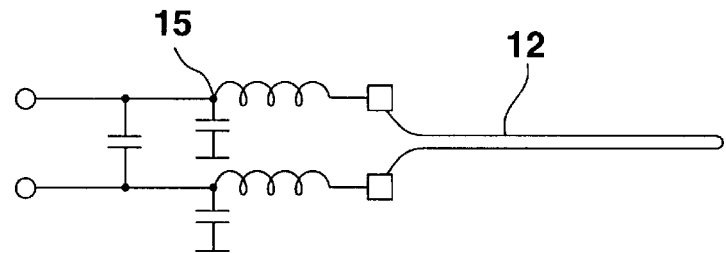
FIG. 8a shows a circuit diagram for a heating coil with upstream low-pass filters.
Figure 9:
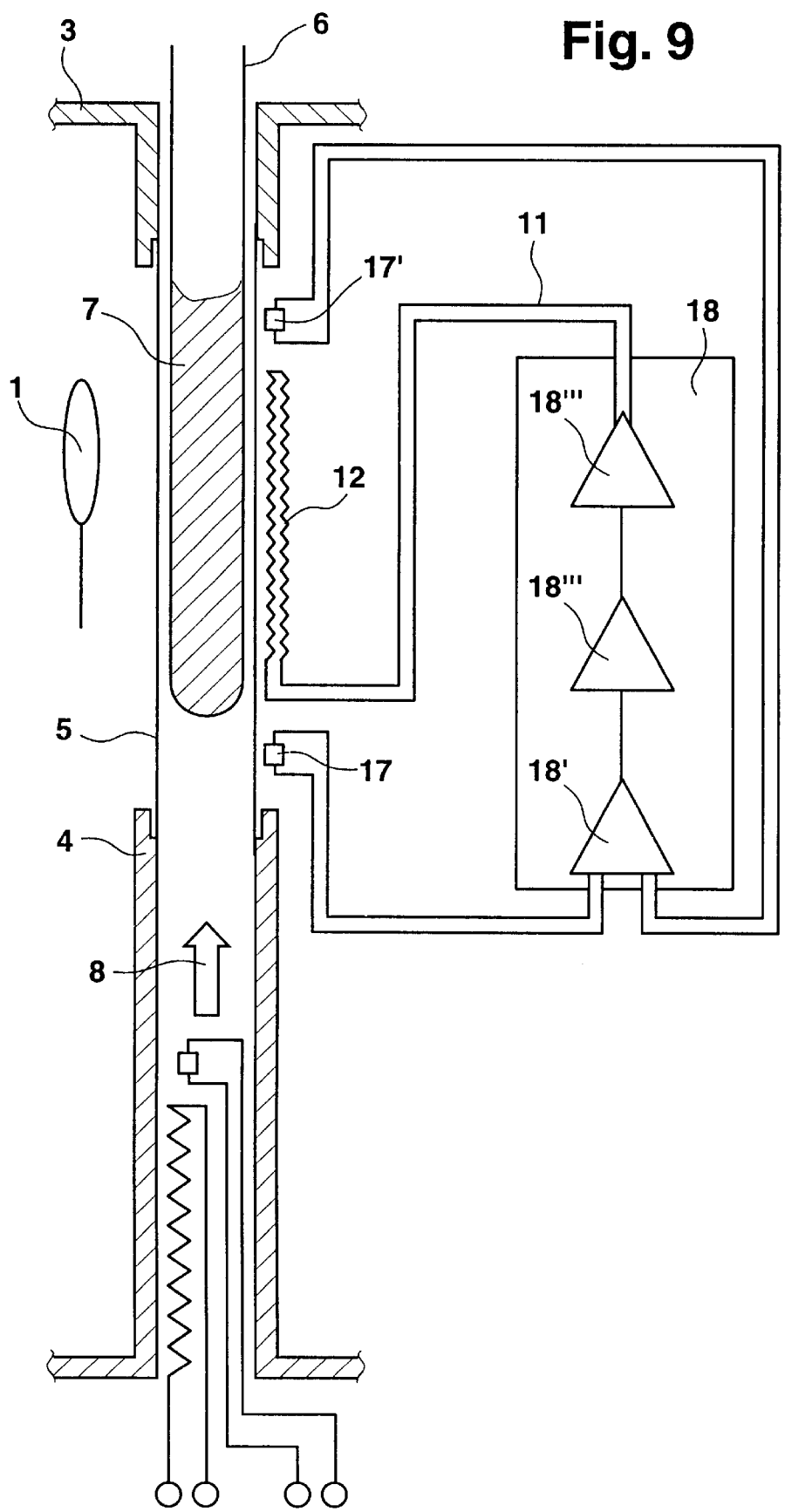
FIG. 9 shows a schematic vertical section through an inventive arrangement comprising heating means, temperature sensors and electronic temperature control.

To minimize signal distortion, disturbing signals and residual attenuation, the electrically heated variant of the inventive tempering means 11 should be provided with a low-pass filter 15 upstream of the corresponding heating coils 12 (see FIG. 8a).

FIG. 8b schematically shows a further improved embodiment wherein an electric rejector circuit 16, 16' is connected upstream of the two inputs of the heating coil 12 which blocks the RF frequencies which are to be measured and which additionally minimizes the influence of the heating current on the NMR measurement such as distortion and attenuation of the measuring frequencies. When an alternating current is used as heating current through the heating coil 12, the angular frequency of the alternating current can be selected such that the sidebands generated thereby are outside of the observeable NMR spectrum.

The heating efficiency can be permanently set in accordance with the expected radial heat flow at a temperature $T_{IN}$ of the tempering gas 8 flowing into the room temperature pipe 4 from the bottom, and be corrected in proportion to the fourth power of that temperature.

Other embodiments permit active regulation of the heating power. For this purpose, two thermometers 17, 17' at the lower and upper ends of the inner pipe 5 of the room temperature pipe 4 can measure the prevailing temperatures $T_1$ or $T_2$ and supply same to an electronic control circuit 18 which controls the tempering means 11. In the most simple case, the control circuit 18 may consist of a differential amplifier 18' which receives the two temperature signals of the thermometers 17, 17' and passes its differential signal on to a regulator 18" which controls a final step 18''' which in turn supplies the tempering means 11, in particular a heating coil 12 with corresponding heating current.

The embodiment of the NMR probe head in accordance with the invention schematically shown in FIG. 10a comprises an RF receiver coil system 1 which is disposed symmetrically, with respect to a z axis, about an axially extending room temperature pipe 4 which serves for accommodating a sample tube 6 containing a sample substance 7 to be examined by NMR measurements.

The RF receiver coil system 1 is mounted onto heat conducting elements 2 which cool the RF receiver coil system 1 to cryogenic temperatures, usually $T_1 \approx 25K$.

The upper and lower sections of the room temperature pipe 4 are connected to a casing 3 of the NMR probe head whereas its central section comprises an inner pipe 5 (mainly of glass) which is permeable to RF fields. The sample tube 6, axially projecting into the room temperature pipe 4, is held at the desired temperature during the measurements by means of a gas flow 8 which is tempered approximately to room temperature $T_2 \approx 300K$.

FIGS. 10a and 10b clearly show that several radiation shields 9 are disposed between the receiver coil system 1 and the room temperature pipe 4 surrounding the room temperature pipe 4 in a radial direction and extending along the z axis. The radiation shields 9 are formed of materials oriented in the z direction which are almost completely transparent to RF fields. The radiation shields 9 are separated from each other in the radial direction and do not contact another or, at the most, have point or linear contacts, as clearly shown in FIG. 10b. They have a radial thickness <0.1 mm, preferably <50 μm. The radiation shields 9 are preferably made from glass or quartz.

To obtain orientation of the material in the z direction as required by the invention, the radiation shields 9 may be formed of a unidirectional foil, of unidirectional fabric, in.

particular of fiber glass mats, or of axially extending rods or fibers, preferably glass or quartz fibers or fiber bundles.

The radiation shields 9 may be freely disposed in space and mounted only at their ends or, as shown in the embodiment, mounted to the room temperature pipe 4.

For reasons of clarity, figures 10a and 10b do not show the centering device in accordance with the invention. It can be incorporated as any of the embodiments described above.

Figure 11A:
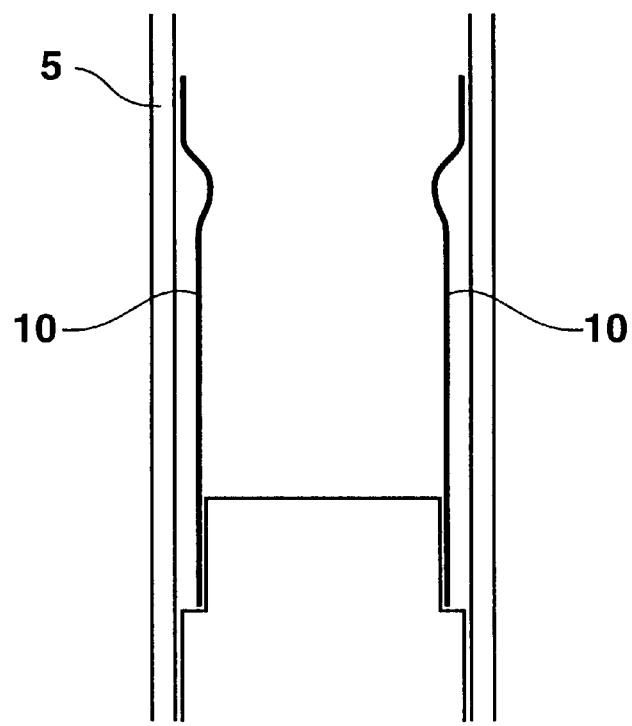
FIG. 11a shows a schematic vertical section through an inventive arrangement with centering device.
Figure 11B:
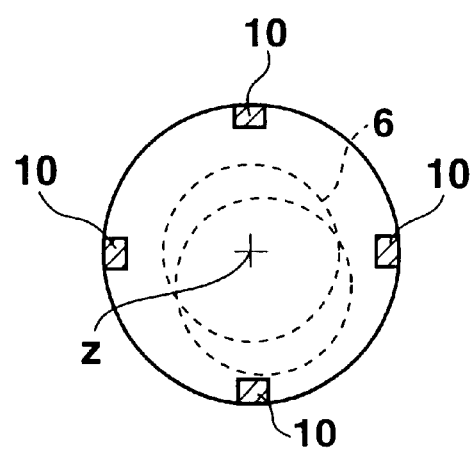

FIGS. 11a and 11b finally show a preferred embodiment of the inventive NMR probe head comprising a centering means having, in the embodiment shown, four spacers 10 symmetrically distributed about the z axis. The associated proper centering of the sample tube 6 within the room temperature pipe 4 prevents convection flow and thereby formation of temperature gradients within the sample substance 7, as already explained above.

I claim:

1. An NMR (nuclear magnetic resonance) probe head, the probe head for receiving a sample tube containing a sample substance to be examined by NMR measurements, the probe head comprising:
   a receiver coil system;
   means for cooling down said receiver coil system to cryogenic temperatures;
   a room temperature pipe, extending along a z-axis, said room temperature pipe for receiving the sample tube; and
   means for controlling temperature disposed between said receiver coil system and the sample tube, said means for controlling temperature extending in the z direction and radially surrounding the sample tube, wherein said means for controlling temperature are substantially transparent to RF fields.

2. The NMR probe head of claim 1, wherein said means for controlling temperature comprise a first layer radially surrounding the sample tube in an axial region of said receiver coil system, said first layer having a radial thickness of <1 mm, said first layer made from a material which at least partially absorbs radiation in a wavelength range of 100 nm$\leq\lambda\leq$100 $\mu$m and which is substantially transparent to radiation in a wavelength range of $\lambda$>100 mm.

3. The NMR probe head of claim 2, further comprising a heating means for uniformly heating said first layer.

4. The NMR probe head of claim 3, wherein said heating means comprises a device for one of irradiating said first layer with radiation in a wavelength range of 100 nm$\leq\lambda\leq$100 $\mu$m and irradiating said first layer with heat radiation.

5. The NMR probe head of claim 4, wherein said device for irradiating said first layer is disposed on a side of said room temperature pipe facing said receiver coil system.

6. The NMR probe head of claim 2, wherein said first layer is disposed on said room temperature pipe at a side thereof facing said receiver coil system.

7. The NMR probe head of claim 2, wherein said first layer surrounds a surface of said room temperature pipe.

8. The NMR probe head of claim 2, wherein said first layer is disposed about said room temperature pipe in axially extending strips which are separated from one another in a peripheral direction.

9. The NMR probe head of claim 1, wherein said tempering means comprises at least one heating coil, each of said at least one heating coil comprising thin material having good electric conductance and each comprising an outgoing and return conductor, wherein said outgoing and said return conductors are electrically connected to one another at a first end and can be supplied with heating current from a current source at a second end.

10. The NMR probe head of claim 9, wherein said heating coil comprises an electrically conducting second layer surrounding the sample tube in an axial region of said receiver coil system, said second layer having a radial thickness which is <1 mm, said second layer substantially transparent to radiation in a wavelength range of $\lambda$>100 mm.

11. The NMR probe head of claim 2, wherein said first layer can be electrically heated.

12. The NMR probe head of claim 10, wherein said second layer can be electrically heated.

13. The NMR probe head of claim 9, wherein said outgoing and return conductors of said heating coil are disposed bifilarly in close mutual proximity.

14. The NMR probe head of claim 13, wherein said outgoing and return conductors comprise two longitudinal strips disposed one on top of the other, said two strips electrically insulated from one another via an insulation layer or insulation strip.

15. The NMR probe head of claim 9, wherein said outgoing and return conductors are substantially made from materials having different magnetic susceptibilities, said magnetic susceptibilities being selected such that said heating coil is magnetically compensated towards an outside.

16. The NMR probe head of claim 9, wherein said at least one heating coil is disposed in a spiral fashion about said room temperature pipe.

17. The NMR probe head of claim 9, wherein one of several and at least 8 heating coils are disposed at a separation from one another in a peripheral direction about the z-axis of said room temperature pipe and extend parallel to the z-axis.

18. The NMR probe head of claim 9, wherein said at least one heating coil is spatially oriented to minimize coupling to said receiver coil system.

19. The NMR probe head of claim 12, wherein said heating coil comprises thin material exhibiting good electrical conductance.

20. The NMR probe head of claim 19, wherein said thin material has a cross section between 1 $\mu$m$^2$ and 100 $\mu$m$^2$.

21. The NMR probe head of claim 9, further comprising at least one of a low-pass filter and a parallel resonant circuit, connected between said current source and said heating coil, said parallel resonant circuit having a resonance at a most sensitive frequency relevant for NMR measurements.

22. The NMR probe head of claim 9, wherein said current source is an alternating current source.

23. The NMR probe head of claim 22, wherein an angular frequency $\omega_H$ for said heating current $I_H=I_0\cdot\cos\omega_H t$ through said heating coil is selected such that associated side bands are outside of an observable NMR spectrum.

24. The NMR probe head of claim 23, wherein 1 kHz $\leq\omega_H/2\pi\leq$10 GHz.

25. The NMR probe head of claim 1, wherein said tempering means comprise a material having good thermal conductance.

26. The NMR probe head of claim 1, further comprising a centering device for centering the sample tube in its measuring position about an axis of said room temperature pipe.

27. The NMR probe head of claim 26, wherein said centering device comprises at least one spacer disposed between said room temperature pipe and the sample tube and distributed symmetrically about a z-axis of said room temperature pipe.

28. The NMR probe head of claim 27, wherein said spacer is at least one of disposed in an area of a bottom of the sample tube in its measuring position and disposed in an area of a feed opening of said room temperature pipe on a side of said room temperature pipe facing the sample tube.

29. The NMR probe head of claim 27, wherein said spacer is disposed along an entire axial length of said receiver coil system on a side of said room temperature pipe facing the sample tube.

30. The NMR probe head of claim 27, wherein said spacer comprises strips of elastic material extending in a direction of the z-axis and which are rigidly connected to said room temperature pipe at their ends facing away from the sample tube in its measuring position and whose ends facing the sample tube in its measuring position have a bead which is bulged towards the sample tube, said bead having a free leg seating on said room temperature pipe.

31. The NMR probe head of claim 27, wherein said spacer comprises a material which is at least one of transparent to RF radiation and magnetically compensated.

32. The NMR probe head of claim 27, wherein said spacer comprises sheet metal strips having a thickness of approximately 100 $\mu$m and a width transverse to the z-axis which is approximately 0.5 mm to 2 mm.

33. The NMR probe head of claim 1, wherein said means for controlling temperature exhibit an absorption for RF fields of <5%.

34. The NMR probe head of claim 33, wherein said means for controlling temperature exhibit an absorption for RF fields of <1%.

35. The NMR probe head of claim 2, wherein said first layer has a radial thickness of <50 $\mu$m.

36. The NMR probe head of claim 10, wherein said second layer has a radial thickness of <50 m.

37. The NMR probe head of claim 24, wherein 10 kHz $\leq \omega_H/2\pi < 1$ MHz.

38. The NMR probe head of claim 32, wherein said width of said sheet metal strips transverse to the z-axis is approximately 1 mm.

* * * * *